(12) United States Patent
Lee

(10) Patent No.: US 10,770,689 B2
(45) Date of Patent: Sep. 8, 2020

(54) LIGHT EMITTING APPARATUS AND LIGHTING DEVICE

(71) Applicant: LG Display Co., Ltd., Seoul (KR)

(72) Inventor: JungHyoung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 31 days.

(21) Appl. No.: 16/214,899

(22) Filed: Dec. 10, 2018

(65) Prior Publication Data

US 2019/0189967 A1    Jun. 20, 2019

(30) Foreign Application Priority Data

Dec. 20, 2017  (KR) .................. 10-2017-0175658

(51) Int. Cl.
| | | |
|---|---|---|
| *H01L 27/28* | (2006.01) | |
| *H01L 25/16* | (2006.01) | |
| *H01L 33/44* | (2010.01) | |
| *H01L 33/40* | (2010.01) | |
| *H01L 33/32* | (2010.01) | |
| *H01L 51/52* | (2006.01) | |

(52) U.S. Cl.
CPC ........ *H01L 51/5268* (2013.01); *H01L 25/167* (2013.01); *H01L 27/286* (2013.01); *H01L 33/44* (2013.01); *H01L 33/32* (2013.01); *H01L 33/405* (2013.01); *H01L 2251/5361* (2013.01); *H01L 2933/0091* (2013.01)

(58) Field of Classification Search
CPC .................................................. H01L 51/5268
See application file for complete search history.

(56) References Cited

U.S. PATENT DOCUMENTS

2009/0272996 A1* 11/2009 Chakraborty ......... H01L 33/501
                                                                 257/98
2010/0001284 A1* 1/2010 Cho .................... H01L 27/1251
                                                                 257/72

FOREIGN PATENT DOCUMENTS

| KR | 10-2006-0104793 A | 10/2006 |
|---|---|---|
| KR | 10-2011-0012432 A | 2/2011 |
| KR | 10-2011-0050985 A | 5/2011 |
| KR | 10-2011-0131381 A | 12/2011 |

* cited by examiner

*Primary Examiner* — William A Harriston
(74) *Attorney, Agent, or Firm* — Birch, Stewart, Kolasch & Birch, LLP

(57) ABSTRACT

Discussed are a light emitting device and a lighting apparatus, which include a substrate, a light emitting diode on the substrate, a refractive index adjustment layer on the light emitting diode, a light scattering layer on the refractive index adjustment layer, a first electrode disposed on the light scattering layer and connected to the light emitting diode, an organic light emitting layer on the first electrode, and a second electrode on the organic light emitting layer. The light scattering layer has a smaller refractive index than the refractive index adjustment layer.

17 Claims, 3 Drawing Sheets

LIGHT EMITTING APPARATUS AND LIGHTING DEVICE

CROSS-REFERENCE TO RELATED APPLICATIONS

This application claims the priority benefit of the Korean Patent Application No. 10-2017-0175658 filed on Dec. 20, 2017 in the Republic of Korea, which is hereby incorporated by reference as if fully set forth herein.

BACKGROUND

Field of the Invention

The present disclosure relates to a light emitting device and a lighting apparatus, and more particularly, to a hybrid light emitting device and lighting apparatus including a light emitting diode (LED) and an organic light emitting device.

Discussion of the Related Art

Recently, along with an increase in luminous efficiency of LEDs, LEDs have replaced fluorescent lamps and have been used as light sources of various lighting apparatuses. Such an LED is also referred to as an electroluminescent (EL) device.

An organic light emitting diode (OLED) using an organic material as a light emitting material is capable of emitting not only three primary colors, red, green, and blue, but also any other colors by using red, green, and blue, and also have small power consumption. Since an OLED has a surface emitting structure, it is easy to realize a flexible form. On the basis of these various advantages of the OLED, research has been actively conducted to use the OLED as a light source for a lighting apparatus or a display apparatus.

However, the OLED has a low light emission efficiency because a light loss occurs inside the OLED due to total reflection, etc. Therefore, in order to apply the OLED to a lighting apparatus or a display apparatus, studies are being conducted to improve the light emission efficiency of the OLED.

SUMMARY

Accordingly, the present disclosure is directed to providing a light emitting device and a lighting apparatus that substantially obviate one or more problems due to limitations and disadvantages of the related art.

An aspect of the present disclosure provides a light emitting device including an LED and an organic light emitting device (e.g., OLED), which has an enhanced light emission efficiency due to refractive index adjustment.

Another aspect of the present disclosure is directed to providing a lighting apparatus including an LED and an organic light emitting device, which has an excellent light emission efficiency.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting device including a substrate, a light emitting diode on the substrate, a refractive index adjustment layer on the light emitting diode, a light scattering layer on the refractive index adjustment layer, a first electrode disposed on the light scattering layer and connected to the light emitting diode, an organic light emitting layer on the first electrode, and a second electrode on the organic light emitting layer, wherein the light scattering layer has a smaller refractive index than the refractive index adjustment layer.

The refractive index adjustment layer and the light scattering layer can have a difference in a refractive index of 0.1 or greater. The refractive index adjustment layer can contain a polymeric resin and a first light scattering agent dispersed in the polymeric resin.

The refractive index adjustment layer can have a lower refractive index than the light emitting diode. The refractive index adjustment layer and the light emitting diode can have a difference in a refractive index of 0.1 or greater. The refractive index adjustment layer can have a refractive index of 1.7 to 2.4.

The light scattering layer can contain a light-transmitting medium and a second light scattering agent dispersed in the light-transmitting medium. The light scattering layer can have a refractive index of 1.6 to 2.3.

The light emitting device can further include a planarization layer between the light scattering layer and the first electrode. The light scattering layer can have a larger refractive index than the planarization layer. The planarization layer can have a refractive index of 1.5 to 2.0.

The light emitting diode can include a p-type electrode on the substrate, a p-type semiconductor layer on the p-type electrode, an active layer on the p-type semiconductor layer, an n-type semiconductor layer on the active layer, and an n-type electrode on the n-type semiconductor layer. The first electrode is connected to the n-type electrode. The p-type semiconductor layer and the n-type semiconductor layer contain gallium nitride (GaN).

A dam surrounding the light emitting diode in a plan view can be disposed on the substrate, and the refractive index adjustment layer can be disposed in a region defined by the dam. The light emitting diode can emit blue light, and the organic light emitting layer can emit yellow light.

In another aspect of the present disclosure, there is provided a lighting apparatus including a substrate, a light emitting diode on the substrate, a refractive index adjustment layer on the light emitting diode, a light scattering layer on the refractive index adjustment layer, a first electrode disposed on the light scattering layer and connected to the light emitting diode, an organic light emitting layer on the first electrode, and a second electrode on the organic light emitting layer, wherein the refractive index adjustment layer has a larger refractive index than the light scattering layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
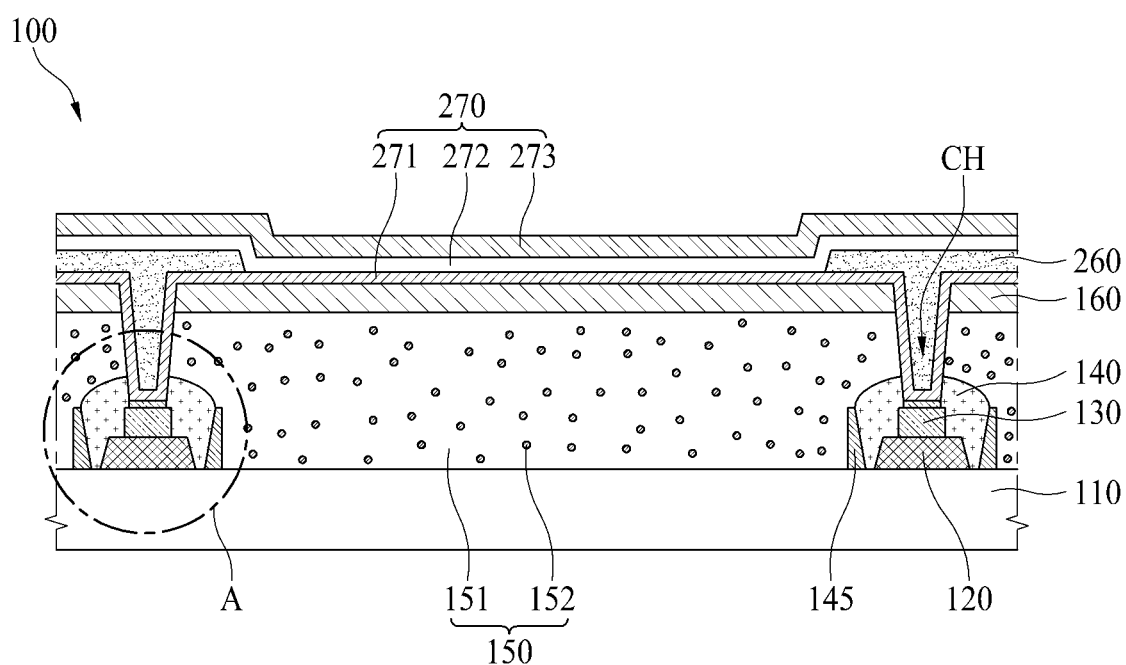
FIG. 1 is a sectional view of a light emitting device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used. Spatially relative terms "below", "beneath", "lower", "above", and "upper" may be used herein for easily describing a relationship between one device or elements and other devices or elements as illustrated in the drawings. It should be understood that spatially relative terms are intended to encompass different orientations of the device in addition to the orientation depicted in the drawings. For example, if a device in the drawings is turned over, elements described as being on the "below" or "beneath" sides of other elements may be placed on "above" sides of the other elements. The exemplary term "lower" may encompass both orientations of "lower" and "upper". Likewise, the exemplary term "above" or "upper" may encompass both orientations of above and below.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings. In the specification, in adding reference numerals for elements in each drawing, it should be noted that like reference numerals already used to denote like elements in other drawings are used for elements wherever possible.

Figure 2:
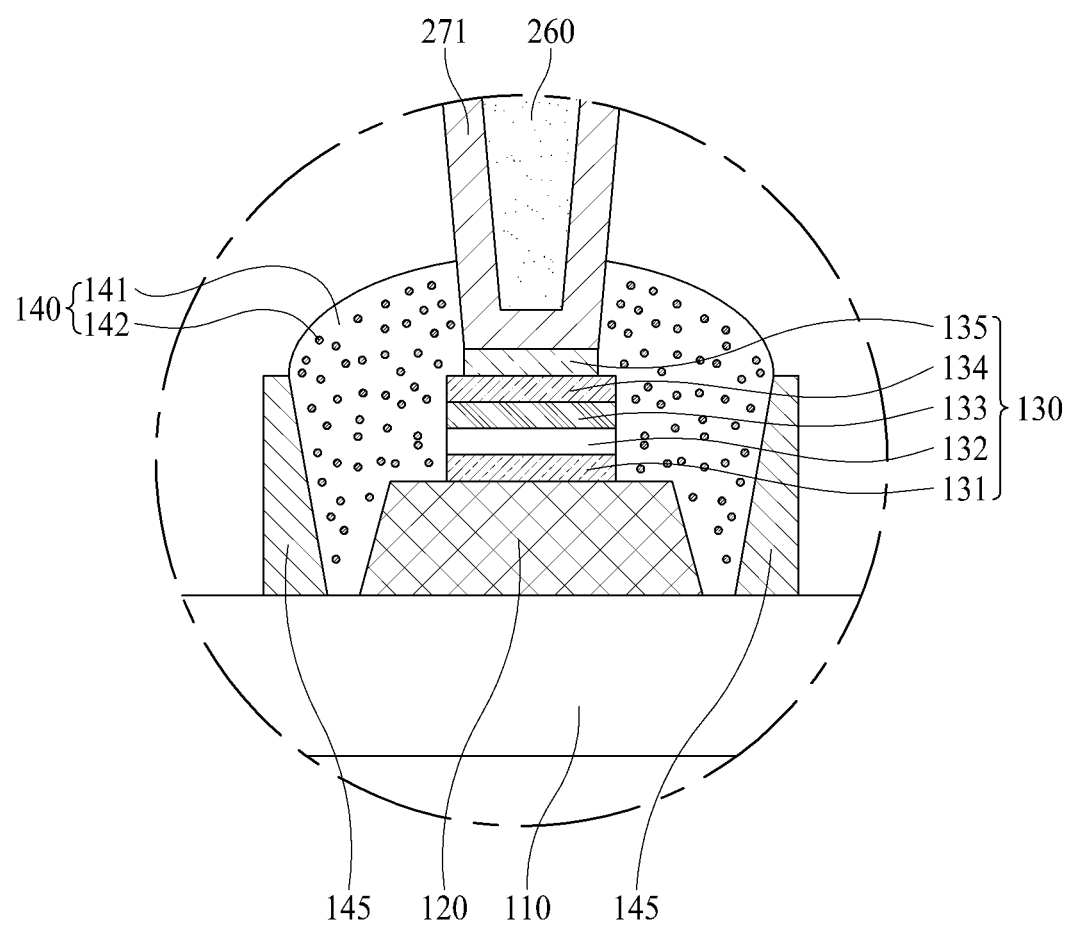
FIG. 2 is an enlarged view of a part A of FIG. 1.

FIG. 1 is a sectional view of a light emitting device 100 according to an embodiment of the present disclosure, and FIG. 2 is an enlarged view of a part A of FIG. 1. All the components of the light emitting devices according to all embodiments of the present disclosure are operatively coupled and configured.

The light emitting device 100 according to the embodiment of the preset disclosure includes a substrate 110, a light emitting diode 130, a refractive index adjustment layer 140, a light scattering layer 150, a first electrode 271, an organic light emitting layer 272, and a second electrode 273. Here, the first electrode 271, the organic light emitting layer 272, and the second electrode 273 constitute an organic light emitting device 270. In the example, the organic light emitting device 270 can be or can include an OLED, but is not limited thereto.

The substrate 110 can be formed of glass or plastic. As the plastic, transparent plastic having flexibility, for example, polyimide can be used. When the polyimide is used for the substrate 110, heat-resistant polyimide capable of withstanding high temperatures can be used considering that a high-temperature process is performed on the substrate 110. However, an embodiment of the present disclosure is not limited thereto, and the substrate 110 can be formed of a metal material.

A wiring 120 is disposed on the substrate 110 to drive the light emitting device 100. The wiring 120 can have different sizes or kinds depending on the light emitting device 100. The wiring 120 includes at least one wiring line and can further include an electrode, a pad, etc.

The wiring 120 can contain at least one of aluminum-based metals such as aluminum (Al) and aluminum alloys, silver-based metals such as silver (Ag) or silver alloys, copper-based metals such as copper (Cu) and copper alloys, molybdenum-based metals such as molybdenum (Mo) and molybdenum alloys, chromium (Cr), tantalum (Ta), neodymium (Nd), and titanium (Ti). The wiring 120 can have a multilayer structure including at least two conductive films having different physical properties.

Also, for electric connection of the light emitting diode 130, a pad or an electrode can be connected to the wiring 120.

The light emitting diode 130 is disposed on the substrate 110. The light emitting diode 130 disposed on the substrate 110 is connected to the wiring 120. For example, the light emitting diode 130 can be disposed on the wiring 120. The light emitting diode 130 can be disposed on an electrode or pad extending from the wiring 120.

There is no particular limitation on the type of the light emitting diode 130. The light emitting diode 130 is also referred to as an LED.

For example, a vertical-structured inorganic diode can be used as the light emitting diode 130. Referring to FIG. 2, the light emitting diode 130 includes a p-type electrode 131 on the substrate 110, a p-type semiconductor layer 132 on the p-type electrode 131, an active layer 133 on the p-type semiconductor layer 132, an n-type semiconductor layer 134 on the active layer 133, and an n-type electrode 135 on the n-type semiconductor layer 134.

According to an embodiment of the present disclosure, the p-type semiconductor layer 132 and the n-type semiconductor layer 134 contain gallium nitride (GaN). In detail, a gallium nitride (GaN)-based diode can be used as the light emitting diode 130. For example, a p-type reflective electrode is used as the p-type electrode 131, a p-type GaN layer is used as the p-type semiconductor layer 132, an InGaN active layer is used as the active layer 133, an n-type GaN layer is used for the n-type semiconductor layer 134, and a Ti/Al film, a Cr/Au film, a Cr/Au film, a Ni/Au film, or the like can be used as the n-type electrode 135.

According to an embodiment of the present disclosure, the light emitting diode 130 emits blue light. However, an embodiment of the present disclosure is not limited thereto, and the light emitting diode 130 can emit green light and red light and also can emit light of another color such as white. According to an embodiment of the present disclosure, light generated inside the light emitting diode 130 is emitted to the outside of the light emitting diode 130 via the n-type GaN layer, which is the n-type semiconductor layer 134.

However, while light is traveling, the light can be reflected or totally reflected on an interface between two layers with a large refractive index difference. In this case, the light can be dissipated without being emitted to the outside. When the light generated by the light emitting diode 130 is not emitted to the outside, the light emission efficiency of the light emitting diode 130 and the light emitting device 100 is decreased by such reflection or total reflection.

According to an embodiment of the present disclosure, the refractive index adjustment layer 140 is disposed on the light emitting diode 130 in order to prevent the light generated in the light emitting diode 130 from being dissipated through reflection or total reflection.

According to an embodiment of the present disclosure, the refractive index adjustment layer 140 has a similar refractive index to the light emitting diode 130. According to an embodiment of the present disclosure, the refractive index of the light emitting diode 130 refers to the refractive index of the n-type semiconductor layer 134, for example, the n-type GaN layer.

When the refractive index adjustment layer 140 has a similar refractive index to the light emitting diode 130, light is prevented from being excessively or totally reflected on an interface between the light emitting diode 130 and the refractive index adjustment layer 140, and thus it is possible to improve the light emission efficiency of the light emitting diode 130.

Meanwhile, the light generated in the light emitting diode 130 is finally emitted to the air having a refractive index of 1.0. According to an embodiment of the present disclosure, in order to prevent a large change in refractive index between layers through which light is passing during the light generated in the light emitting diode 130 emits to the air, the refractive indices of the layers are set to decrease as the distance from the light emitting diode 130 increases. Accordingly, the refractive index of the refractive index adjustment layer 140 is set to be lower than the refractive index of the light emitting diode 130.

The n-type GaN layer, which forms the n-type semiconductor layer 134, has a refractive index of about 2.3 to about 2.5. Accordingly, the refractive index adjustment layer 140 has a refractive index of 1.7 to 2.4. When the refractive index of the refractive index adjustment layer 140 is less than 1.7, the refractive indices of the light emitting diode 130 and the refractive index adjustment layer 140 can have a large difference, resulting in a decrease in light extraction efficiency. When the refractive index of the refractive index adjustment layer 140 is greater than 2.4, the refractive indices of the refractive index adjustment layer 140 and another layer, for example, the light scattering layer 150, can have a large difference.

According to an embodiment of the present disclosure, the difference between the refractive indices of the light emitting diode 130 and the refractive index adjustment layer 140 is greater than or equal to 0.1. Thus, the refractive indices of the layers can gradually decrease in a direction away from the light emitting diode 130.

According to an embodiment of the present disclosure, the refractive index adjustment layer 140 includes a polymeric resin 141 and a first light scattering agent 142 dispersed in the polymeric resin 141.

For example, light-transmitting acrylic resin, polyimide, polyamide, polycarbonate, polystyrene, polyethylene terephthalate, or the like can be used as the polymeric resin 141. However, the type of polymeric resin is not limited thereto, and other transparent polymeric resins known in the art can be used as the polymeric resin 141 according to an embodiment of the present disclosure.

The polymeric resin 141 can have a refractive index of 1.5 to 1.7. Accordingly, by using only the polymeric resin 141, it is not possible to obtain a refractive index required by the refractive index adjustment layer 140. In order to increase the refractive index of the refractive index adjustment layer 140, the refractive index adjustment layer 140 contains the first light scattering agent 142.

The first light scattering agent 142 scatters light to enhance the light emission efficiency, as well as increasing the refractive index of the refractive index adjustment layer 140. In order to increase the refractive index of the refractive index adjustment layer 140, the first light scattering agent 142 can have a refractive index of, for example, 1.7 to 2.7.

The first light scattering agent 142 can contain at least one of, for example, $TiO_2$, $ZrO_2$, $CeO_2$, and $TaO_2$. However, an embodiment of the present disclosure is not limited thereto, other light scattering agents known in the art or commercially available can also be used.

The first light scattering agent 142 can have a diameter of 200 nm to 800 nm. When the diameter of the first light scattering agent is less than 200 nm, light is not scattered. Thus, it is difficult to expect improvement in the light emission efficiency caused by the first light scattering agent 142. On the other hand, when the diameter of the first light scattering agent 142 is greater than 800 nm, the first light scattering agent 142 is not easily dispersed in the polymeric resin 141.

Referring to FIGS. 1 and 2, a dam 145 surrounding the light emitting diode 130 in a plan view is disposed on the substrate 110. The refractive index adjustment layer 140 is disposed in a region defined by the dam 145.

According to an embodiment of the present disclosure, the refractive index adjustment layer 140 can be formed by a liquid-phase polymeric resin 141 containing the first light scattering agent 142. At this time, the dam 145 restricts the flow of the liquid-phase polymeric resin 141 so that the polymeric resin 141 can sufficiently coat the light emitting diode 130. Thus, the refractive index adjustment layer 140 can be formed in a region defined by the dam 145.

The dam 145 can be made of an organic material or an inorganic material with shape stability and insulation. For example, the dam 145 can contain at least one of a polymeric resin, a silicon oxide, a silicon nitride, a metal oxide, and a metal nitride.

The light scattering layer 150 is disposed on the refractive index adjustment layer 140. Referring to FIG. 1, the light scattering layer 150 is entirely disposed on the substrate 110 including the refractive index adjustment layer 140. The light scattering layer 150 scatters light emitted from the light emitting diode 130 and the organic light emitting device 270.

According to an embodiment of the present disclosure, the light scattering layer 150 can have a smaller refractive index than the refractive index adjustment layer 140. Also, the refractive indices of the refractive index adjustment layer 140 and the light scattering layer 150 have a difference of 0.1 or greater. Thus, a layer disposed away from the light emitting diode 130 has a smaller refractive index than a layer disposed close to the light emitting diode 130. Accordingly, it is possible to prevent a large change in refractive index between layers when light generated in the light emitting diode 130 is emits to the outside.

According to an embodiment of the present disclosure, the light scattering layer 150 has a refractive index of 1.6 to 2.3. When the refractive index of the light scattering layer 150 is less than 1.6, the refractive indices of the refractive index adjustment layer 140 and the light scattering layer 150 can have a large difference, resulting in a decrease in light extraction efficiency. When the refractive index of the light scattering layer 150 is greater than 2.3, the light scattering layer 150 and another layer can have a large difference in refractive index. According to another embodiment, the light scattering layer 150 can have a refractive index of 1.7 to 2.3.

The light scattering layer 150 contains a light-transmitting medium 151 and a second light scattering agent 152 dispersed in the light-transmitting medium 151.

An organic material or inorganic material can be used as the light-transmitting medium 151. For example, the light-transmitting medium 151 can include a polymeric resin. The polymeric resin for forming the light-transmitting medium 151 can include acrylic resin, polyimide, polyamide, polycarbonate, polystyrene, polyethylene terephthalate, and the like. The light-transmitting medium 151 can be the same as the polymeric resin 141 forming the refractive index adjustment layer 140.

The second light scattering agent 152 increases the refractive index of the light scattering layer 150 and scatters light to improve light emission efficiency. The second light scattering agent 152 has a refractive index of 1.7 to 2.7. The second light scattering agent 152 can contain at least one of, for example, $TiO_2$, $ZrO_2$, $CeO_2$, and $TaO_2$. The second light scattering agent 152 can be the same as the first light scattering agent 142.

The refractive indexes of the refractive index adjustment layer 140 and the light scattering layer 150 can be varied depending on the content ratios of the first light scattering agent 142 and the second light scattering agent 152.

Referring to FIG. 1, a planarization layer 160 is disposed on the light scattering layer 150. The planarization layer 160 flattens an upper portion of the substrate and protects a first electrode 271 disposed over the planarization layer 160.

According to an embodiment of the present disclosure, the light scattering layer 150 can have a larger refractive index than the planarization layer 160.

The planarization layer 160 can have a refractive index of 1.5 to 2.0. In another embodiment, the planarization layer 160 can have a refractive index of 1.7 to 2.0. Also, the planarization layer 160 can contain a light scattering agent. The planarization layer 160 can be made of an organic material such as a polymeric resin.

An organic light emitting device 270 is disposed on the planarization layer 160. In detail, the first electrode 271 is disposed on the planarization layer 160, an organic light emitting layer 272 is disposed on the first electrode 271, and a second electrode 273 is disposed on the organic light emitting layer 272. Accordingly, the organic light emitting device 270 is formed to include the first electrode 271, the organic light emitting layer 272, and the second electrode 273.

The first electrode 271 can function as an anode electrode, and the second electrode 273 can function as a cathode electrode. However, an embodiment of the present disclosure is not limited thereto, and the first electrode 271 and the second electrode 273 can have opposite polarities.

The first electrode 271 is a transparent electrode. The first electrode 271 can be formed of, for example, ITO, IZO, ZnO, or $In_2O_3$, which has a large work function.

For a bottom emission type, in which light is emitted toward the substrate 110, the second electrode 273 can be a reflective electrode. In this case, the second electrode 273 can be formed of a metal having a small work function, such as Ag, Mg, Al, Pt, Pd, Au, Ni, Nd, Ir, Cr, Li, and Ca.

For a top emission type, in which light is emitted toward the second electrode 273, the second electrode 273 can be a transparent electrode. In this case, the second electrode 273 can include a thin film formed of a metal having a small work function, such as g, Mg, Al, Pt, Pd, Au, Ni, Nd, Ir, Cr, Li, and Ca, and a light-transmitting film formed of ITO, IZO, ZnO, or $In_2O_3$ or an auxiliary wiring that is disposed on the thin film and. Also, for the top emission type, the substrate 110 can include a reflective film.

For a dual emission type, both the first electrode 271 and the second electrode 273 can be transparent electrodes.

The organic light emitting layer 272 can be disposed between the first electrode 271 and the second electrode 273 and can include at least one light emitting layer (EML), In detail, the organic light emitting layer 272 can include one light emitting layer and can include two or more light emitting layers that are vertically stacked. Also, the organic light emitting layer 272 can further include at least one of a hole injection layer (HIL), a hole transport layer (HTL), an electron transport layer (ETL), and an electron injection layer (EIL). The organic light emitting layer 272 can emit light of any one of red, blue, and green and can emit white light. The organic light emitting layer 272 can emit yellow light.

In order to protect the organic light emitting device 270, a capping layer can be disposed on the second electrode 273.

According to an embodiment of the present disclosure, the organic light emitting device 270 is connected to the light emitting diode 130. Referring to FIG. 1, the first electrode 271 of the organic light emitting device 270 is connected to the light emitting diode 130 through a contact hole CH formed to partially pass through the refractive index adjustment layer 140, the light scattering layer 150, and the planarization layer 160. In this case, the first electrode 271 can be connected to an n-type electrode of the light emitting diode 130. Thus, the light emitting diode 130 and the organic light emitting device 270 are connected in series so that the light emitting device 100 is formed to have a tandem structure.

Referring to FIG. 1, the contact hole CH is filled with a filler layer 260. The filler layer 260 is placed even on top of the first electrode 271 to horizontally form a stepped portion on top of the first electrode 271. The filler layer 260 causes the organic light emitting layer 272 and the second electrode 273 to have respective stepped portions. When the organic light emitting layer 272 and the second electrode 273 have the stepped portions, a route along which light is horizontally traveling while repeatedly reflecting between the first electrode 271 and the second electrode 273 can change, and thus reflection can occur at the stepped portions. With the change in path or the reflection, light is emitted to the outside, and thus it is possible to enhance light emission efficiency of the light emitting device 100.

For example, when light generated in the organic light emitting layer 272 is repeatedly reflected between the first electrode 271 and the second electrode 273 to travel horizontally with no change in path, the light is dissipated without being emitted to the outside. However, according to an embodiment of the present disclosure, stepped portions are formed on the organic light emitting layer 272 and the second electrode 273 such that a path of light horizontally traveling is changed and reflection can occurred at the stepped portions. As a result, the probability that light horizontally traveling will be emitted to the outside increases, and thus it is possible to improve the light emission efficiency of the light emitting device 100.

According to an embodiment of the present disclosure, the light emitting diode 130 can emit blue light, and the organic light emitting layer 272 can emit yellow light. Thus, the light emitting device 100 can emit white light. Such a light emitting device 100 can be used as a lighting apparatus.

Figure 3:
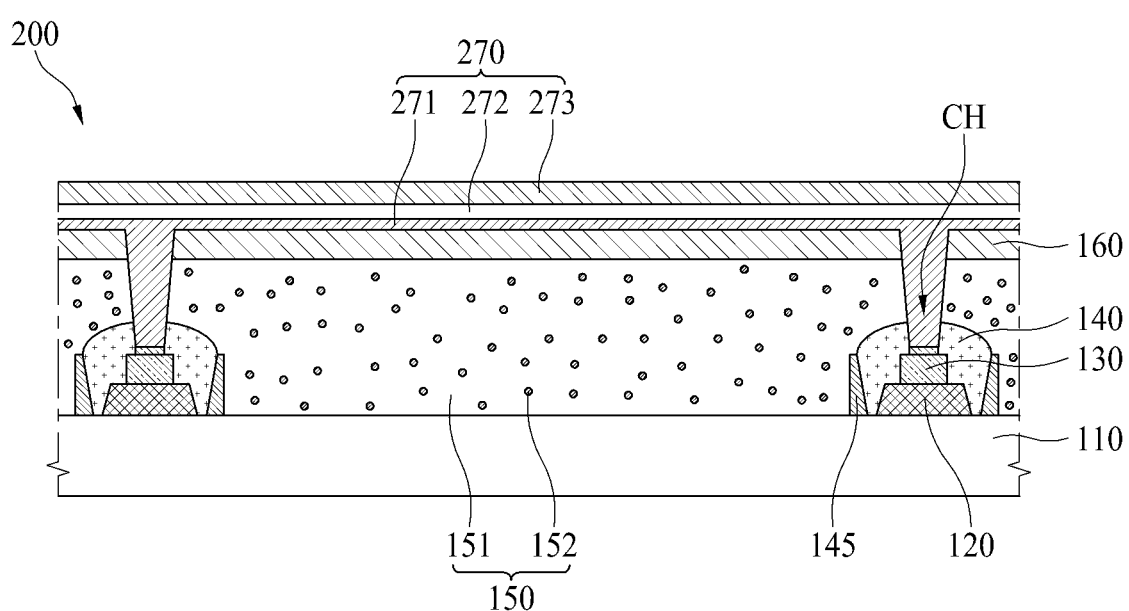
FIG. 3 is a sectional view of a light emitting device according to another embodiment of the present disclosure.

FIG. 3 is a sectional view of a light emitting device 200 according to another embodiment of the present disclosure.

Unlike the light emitting device 100 shown in FIG. 1, the light emitting device 200 shown in FIG. 3 does not have the filler layer 260. Since the filler layer 260 is not included, light generated in the light emitting diode 130 is not reflected nor absorbed by the filler layer 260. Thus, it is possible to improve the light emission efficiency of the light emitting device 200.

According to still another embodiment of the present disclosure, a lighting apparatus is provided. The lighting apparatus according to this embodiment of the present disclosure includes the light emitting device 100 or 200 shown in FIG. 1 or 3.

Alternatively, the lighting apparatus according to still another embodiment of the present disclosure can have the same structure as the light emitting device 100 or 200 shown in FIG. 1 or 3.

In detail, the lighting apparatus according to another embodiment of the present disclosure can include a substrate 110, a light emitting diode 130 on the substrate 110, a refractive index adjustment layer 140 on the light emitting diode 130, a light scattering layer 150 on the refractive index adjustment layer 140, a first electrode 271 disposed on the light scattering layer 150 and connected to the light emitting diode 130, an organic light emitting layer 272 on the first electrode 271, and a second electrode 273 on the organic light emitting layer 272. Here, the first electrode 271, the organic light emitting layer 272, and the second electrode 273 constitute an organic light emitting device 270. The refractive index adjustment layer 140 has a larger refractive index than the light scattering layer 150.

Also, the lighting apparatus according to still another embodiment of the present disclosure can further include a planarization layer 160 on the light scattering layer 150.

According to still another embodiment of the present disclosure, the first electrode 271 can be connected to the light emitting diode 130 through a contact hole CH formed in the refractive index adjustment layer 140, the light scattering layer 150, and the planarization layer 160. Also, the lighting apparatus can further include a filler layer 260 on the first electrode.

The light emitting device according to an embodiment of the present disclosure includes a LED and an organic light emitting device (e.g., OLED) and has an excellent light emission efficiency because the refractive indices of the layers constituting the light emitting device are adjusted to enhance the light extraction efficiency. Also, the lighting apparatus according to another embodiment of the present disclosure comprises such a light emitting device or has the same structure as the light emitting device, and thus has an excellent light emission efficiency and surface light source implementation capability.

The present disclosure is not limited to the aforementioned embodiments and the accompanying drawings, and it will be apparent to those skilled in the art that various substitutions, modifications, and changes can be made without departing from the spirit of the present disclosure. Therefore, the scope of the present disclosure is defined by the appended claims, and all changes or modifications derived from the meaning and scope of the claims and their equivalents should be construed as being included within the scope of the present disclosure.

What is claimed is:

1. A light emitting device comprising:
    a substrate;
    a light emitting diode on the substrate;
    a refractive index adjustment layer on the light emitting diode;
    a light scattering layer on the refractive index adjustment layer;
    a first electrode disposed on the light scattering layer and connected to the light emitting diode;
    an organic light emitting layer on the first electrode; and
    a second electrode on the organic light emitting layer,
    wherein the light scattering layer has a smaller refractive index than the refractive index adjustment layer.

2. The light emitting device of claim 1, wherein the refractive index adjustment layer and the light scattering layer have a difference in a refractive index of 0.1 or greater.

3. The light emitting device of claim 1, wherein the refractive index adjustment layer contains a polymeric resin and a first light scattering agent dispersed in the polymeric resin.

4. The light emitting device of claim 1, wherein the refractive index adjustment layer has a lower refractive index than the light emitting diode.

5. The light emitting device of claim 4, wherein the refractive index adjustment layer and the light emitting diode have a difference in a refractive index of 0.1 or Greater.

6. The light emitting device of claim 1, wherein the refractive index adjustment layer has a refractive index of approximately 1.7 to 2.4.

7. The light emitting device of claim 1, wherein the light scattering layer contains a light-transmitting medium and a second light scattering agent dispersed in the light-transmitting medium.

8. The light emitting device of claim 1, wherein the light scattering layer has a refractive index of approximately 1.6 to 2.3.

9. The light emitting device of claim 1, further comprising a planarization layer between the light scattering layer and the first electrode.

10. The light emitting device of claim 9, wherein the light scattering layer has a larger refractive index than the planarization layer.

11. The light emitting device of claim 9, wherein the planarization layer has a refractive index of approximately 1.5 to 2.0.

12. The light emitting device of claim 1, wherein the light emitting diode comprises:
a p-type electrode on the substrate;
a p-type semiconductor layer on the p-type electrode;
an active layer on the p-type semiconductor layer;
an n-type semiconductor layer on the active layer; and
an n-type electrode on the n-type semiconductor layer.

13. The light emitting device of claim 12, wherein the first electrode is connected to the n-type electrode.

14. The light emitting device of claim 12, wherein the p-type semiconductor layer and the n-type semiconductor layer contain gallium nitride (GaN).

15. The light emitting device of claim 1, further comprising a dam surrounding the light emitting diode in a plan view and disposed on the substrate,
wherein the refractive index adjustment layer is disposed in a region defined by the dam.

16. The light emitting device of claim 1, wherein
the light emitting diode emits blue light, and
the organic light emitting layer emits yellow light.

17. A lighting apparatus comprising:
a light emitting diode on a substrate;
a refractive index adjustment layer on the light emitting diode;
a light scattering layer on the refractive index adjustment layer;
a first electrode disposed on the light scattering layer;
an organic light emitting layer on the first electrode; and
a second electrode on the organic light emitting layer,
wherein the refractive index adjustment layer has a larger refractive index than the light scattering layer.

* * * * *